(12) United States Patent
You et al.

(10) Patent No.: US 12,526,980 B2
(45) Date of Patent: Jan. 13, 2026

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Se-Ho You, Seoul (KR); Ju-Il Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 709 days.

(21) Appl. No.: 17/837,379

(22) Filed: Jun. 10, 2022

(65) Prior Publication Data

US 2023/0133977 A1    May 4, 2023

(30) Foreign Application Priority Data

Oct. 29, 2021 (KR) .................. 10-2021-0146726

(51) Int. Cl.
    *H10B 12/00*      (2023.01)

(52) U.S. Cl.
    CPC ......... *H10B 12/312* (2023.02); *H10B 12/318* (2023.02)

(58) Field of Classification Search
None
See application file for complete search history.

(56) References Cited

U.S. PATENT DOCUMENTS

| | | | |
|---|---|---|---|
| 9,502,386 B2 | 11/2016 | Yu et al. | |
| 9,595,509 B1 | 3/2017 | Yap | |
| 9,761,565 B2 | 9/2017 | Vincent et al. | |
| 10,217,719 B2 | 2/2019 | Watanabe et al. | |
| 10,396,753 B2 | 8/2019 | Reisner et al. | |
| 10,943,858 B2 | 3/2021 | Kelly et al. | |
| 11,062,998 B2 | 7/2021 | Tsai et al. | |
| 11,069,657 B2 | 7/2021 | Wei et al. | |
| 2018/0294249 A1* | 10/2018 | Watanabe | H01L 24/20 |
| 2020/0075435 A1 | 3/2020 | Chen et al. | |
| 2021/0134749 A1 | 5/2021 | Kuo et al. | |
| 2021/0159182 A1* | 5/2021 | Jeng | H01G 4/40 |

FOREIGN PATENT DOCUMENTS

| | | | |
|---|---|---|---|
| KR | 1020160122769 A | 10/2016 | |
| KR | 1020180030147 A | 3/2018 | |
| KR | 1020180032516 A | 3/2018 | |
| KR | 1020210010806 A | 1/2021 | |

\* cited by examiner

*Primary Examiner* — Nicholas J Tobergte
(74) *Attorney, Agent, or Firm* — Muir Patent Law, PLLC

(57) ABSTRACT

A semiconductor device including a substrate and first and second packages thereon, the first package includes a first lower redistribution layer; a first core semiconductor stack thereon and including a first core chip and a first through via stacked on the first lower redistribution layer; and a first memory semiconductor stack on the first lower redistribution layer and including first memory chips stacked on the first lower redistribution layer, the second package includes a second lower redistribution layer; a second core semiconductor stack thereon and including a second core chip on the second lower redistribution layer; and a second memory semiconductor stack on the second lower redistribution layer and including second memory chips stacked on the second lower redistribution layer, the first through via penetrates the first core semiconductor stack, and the first and second lower redistribution layers are electrically connected to each other through the first through via.

20 Claims, 13 Drawing Sheets

SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0146726 filed on Oct. 29, 2021, in the Korean Intellectual Property Office, the disclosure of which is hereby incorporated by reference in its entirety.

BACKGROUND

1. Field

Embodiments relate to a semiconductor device, and a method of fabricating the same.

2. Description of the Related Art

For high integration of semiconductor devices, a method may be used for stacking a plurality of semiconductor chips. For example, a multi-chip package in which a plurality of semiconductor chips are mounted in a single semiconductor package or a system-in-package in which stacked different chips are operated as one system has been considered.

SUMMARY

The embodiments may be realized by providing a semiconductor device including a substrate; a first package on the substrate; and a second package on the first package, wherein the first package includes a first lower redistribution layer; a first core semiconductor stack on the first lower redistribution layer, the first core semiconductor stack including at least one first core chip and a first through via that are stacked on the first lower redistribution layer; and a first memory semiconductor stack on the first lower redistribution layer, the first memory semiconductor stack includes a plurality of first memory chips that are stacked on the first lower redistribution layer, the second package includes a second lower redistribution layer; a second core semiconductor stack on the second lower redistribution layer, the second core semiconductor stack including at least one second core chip on the second lower redistribution layer; and a second memory semiconductor stack on the second lower redistribution layer, the second memory semiconductor stack includes a plurality of second memory chips that are stacked on the second lower redistribution layer, the first through via penetrates the first core semiconductor stack, and the first lower redistribution layer and the second lower redistribution layer are electrically connected to each other through the first through via.

The embodiments may be realized by providing a semiconductor device including a lower redistribution layer; an upper redistribution layer on the lower redistribution layer; and a core semiconductor stack and a memory semiconductor stack between the lower redistribution layer and the upper redistribution layer, wherein the core semiconductor stack includes a first core chip adjacent to the lower redistribution layer, the first core chip including a first front-side structure and a first back-side structure; a second core chip on the first core chip and adjacent to the upper redistribution layer, the second core chip including a second front-side structure and a second back-side structure; and a through via that extends from the lower redistribution layer to the upper redistribution layer, the memory semiconductor stack includes a plurality of memory chips that are stacked between the lower redistribution layer and the upper redistribution layer, the first front-side structure of the first core chip is in contact with the lower redistribution layer, the second front-side structure of the second core chip is in contact with the upper redistribution layer, and the first back-side structure of the first core chip is in contact with the second back-side structure of the second core chip.

The embodiments may be realized by providing a semiconductor package including a package substrate; a semiconductor device on the package substrate; a plurality of substrate bumps between the package substrate and the semiconductor device; and an under-fill layer that fills a space between the substrate bumps, wherein the semiconductor device includes a substrate; a first package on the substrate; and a second package on the first package, the first package includes a first lower redistribution layer; a first core semiconductor stack on the first lower redistribution layer, the first core semiconductor stack including a first core chip and a first through via that are stacked on the first lower redistribution layer; and a first memory semiconductor stack on the first lower redistribution layer, the first memory semiconductor stack includes a plurality of first memory chips that are stacked on the first lower redistribution layer, the second package includes a second lower redistribution layer; a second core semiconductor stack on the second lower redistribution layer, the second core semiconductor stack including a second core chip on the second lower redistribution layer; and a second memory semiconductor stack on the second lower redistribution layer, the second memory semiconductor stack includes a plurality of second memory chips that are stacked on the second lower redistribution layer, the first through via penetrates the first core semiconductor stack, and the first lower redistribution layer and the second lower redistribution layer are electrically connected to each other through the first through via.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
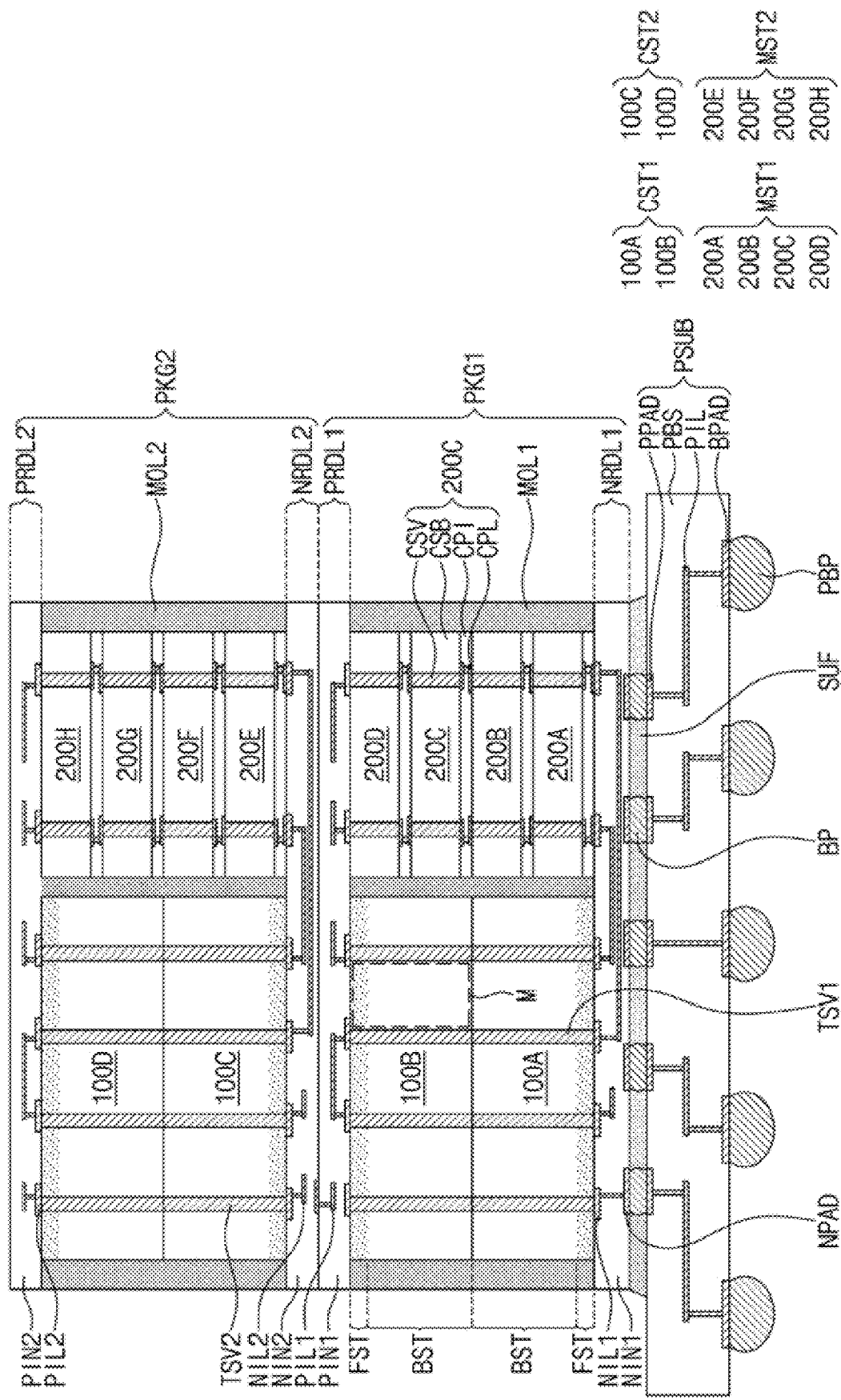
FIG. 1 illustrates a cross-sectional view of a semiconductor device according to some embodiments.
Figure 2:
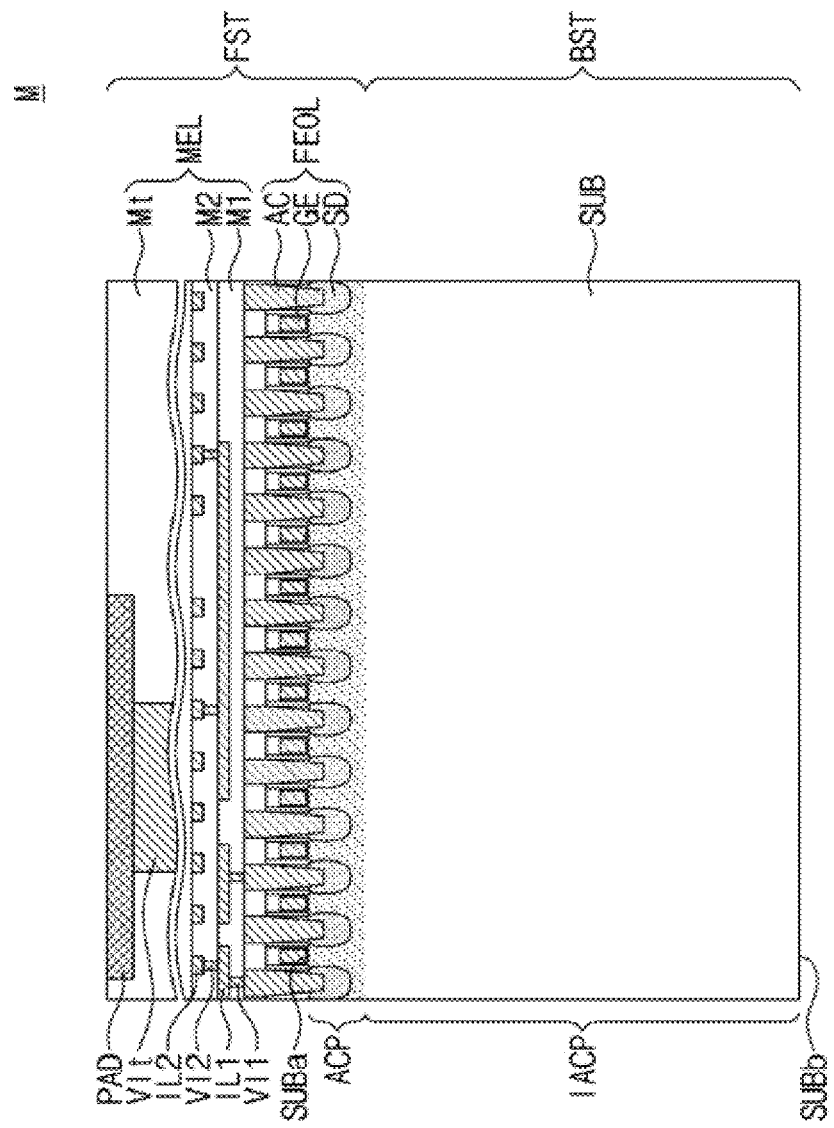
FIG. 2 illustrates an enlarged view showing section M of FIG. 1.

FIG. 1 illustrates a cross-sectional view of a semiconductor device according to some embodiments. FIG. 2 illustrates an enlarged view showing section M of FIG. 1. The following will describe in detail a semiconductor device with reference to FIGS. 1 and 2.

Referring to FIG. 1, a semiconductor device 10 may include a package substrate PSUB, a first package PKG1 on the package substrate PSUB, and a second package PKG2 on the first package PKG1.

The package substrate PSUB may include a dielectric base layer PBS, package substrate pads PPAD, terminal pads BPAD, and package substrate lines PIL. In an implementation, the package substrate PSUB may be a printed circuit board (PCB). The dielectric base layer PBS may include a single layer or a plurality of stacked layers.

The package substrate pads PPAD may be adjacent to or at a top surface (e.g., first package PKG1-facing surface) of the package substrate PSUB, and the terminal pads BPAD may be adjacent to or at a bottom surface of the package substrate PSUB. The package substrate pads PPAD may be exposed on or at the top surface of the package substrate PSUB.

The package substrate lines PIL may be in the dielectric base layer PBS, and may be electrically connected to the package substrate pads PPAD and the terminal pads BPAD. The package substrate pads PPAD, the terminal pads BPAD, and the package substrate lines PIL may include a conductive metallic material, e.g., copper (Cu), aluminum (Al), tungsten (W), or titanium (Ti). As used herein, the term "or" is not an exclusive term, e.g., "A or B" would include A, B, or A and B.

The package substrate PSUB may include external terminals PBP on the bottom surface thereof. The external terminals PBP may be on bottom surfaces of the terminal pads BPAD. The external terminals PBP may be electrically connected to the package substrate lines PIL.

The external terminal PBP may be coupled to an external device. In an implementation, external electrical signals may be transmitted through the external terminals PBP to or from the package substrate pads PPAD. The external terminals PBP may include solder balls or solder bumps. The external terminals PBP may include a conductive metallic material, e.g., tin (Sn), lead (Pb), silver (Ag), zinc (Zn), nickel (Ni), gold (Au), copper (Cu), aluminum (Al), or bismuth (Bi).

The package substrate PSUB may include substrate bumps BP and substrate under-fill layer SUF thereon. The substrate bumps BP may be correspondingly connected to the package substrate pads PPAD on the top surface of the package substrate PSUB. The substrate bumps BP may be between the package substrate PSUB and the first package PKG1. The substrate bumps BP may electrically connect the package substrate PSUB to the first package PKG1. The substrate bumps BP may include a conductive material, and may have, e.g., solder ball shapes, bump shapes, or pillar shapes. A pitch of the substrate bumps BP may be less than that of the external terminals PBP.

The substrate under-fill layer SUF may be between the package substrate PSUB and the first package PKG1. The substrate under-fill layer SUF may fill a space between the substrate bumps BP and may encapsulate the substrate bumps BP. In an implementation, the substrate under-fill layer SUF may include a non-conductive film (NCF), e.g., an Ajinomoto build-up film (ABF).

The first package PKG1 may be on the package substrate PSUB. The first package PKG1 may include a first lower redistribution layer NRDL1, a first core semiconductor stack CST1 on the first lower redistribution layer NRDL1, a first memory semiconductor stack MST1 on the first lower redistribution layer NRDL1, and a first upper redistribution layer PRDL1 at a top of the first package PKG1. In an implementation, the first package PKG1 may have an area of about 400 square millimeters (20 mm×20 mm) to 1,600 square millimeters (40 mm×40 mm).

The first lower redistribution layer NRDL1 may be on the package substrate PSUB. The first lower redistribution layer NRDL1 may include first lower lines NIL1, lower pads NPAD, and a first lower dielectric layer NIN1. The first lower lines NIL1 may be in the first lower dielectric layer NIN1. In an implementation, the first lower redistribution layer NRDL1 may have an area of about 400 square millimeters (20 mm×20 mm) to 1,600 square millimeters (40 mm×40 mm).

The first lower lines NIL1 and the lower pads NPAD may include a conductive metallic material, e.g., copper (Cu), aluminum (Al), tungsten (W), or titanium (Ti). The first lower dielectric layer NIN1 may include, e.g., silicon nitride, silicon oxide, or silicon oxynitride.

One (or more) of the first lower lines NIL1 exposed on or at a top surface of the first lower redistribution layer NRDL1 may be electrically connected to the first core semiconductor stack CST1. Another one (or more) of the first lower lines NIL1 exposed on or at the top surface of the first lower redistribution layer NRDL1 may be electrically connected to the first memory semiconductor stack MST1. The first core semiconductor stack CST1 and the first memory semiconductor stack MST1 may be electrically connected to each other through the first lower lines NIL1 of the first lower redistribution layer NRDL1.

The lower pads NPAD on a bottom surface of the first lower redistribution layer NRDL1 may be connected to corresponding substrate bumps BP. The first lower redistribution layer NRDL1 and the package substrate PSUB may be electrically connected to each other through the substrate bumps BP.

The first core semiconductor stack CST1 may be mounted on the first lower redistribution layer NRDL1. The first core semiconductor stack CST1 may include a first core chip 100A, a second core chip 100B on the first core chip 100A, and first through vias TSV1. In an implementation, the first core semiconductor stack CST1 may have an area of about 25 square millimeters (5 mm×5 mm) to 225 square millimeters (15 mm×15 mm).

Each of the first and second core chips 100A and 100B may include a front-side structure FST and a back-side structure BST. The front-side structure FST of the first core chip 100A may be adjacent to the first lower redistribution layer NRDL1. The front-side structure FST of the second core chip 100B may be adjacent to the first upper redistribution layer PRDL1. The back-side structure BST of the first core chip 100A may face the back-side structure BST of the second core chip 100B. The front-side structure FST of the first core chip 100A may be opposite to (e.g., face away from) the front-side structure FST of the second core chip 100B.

The front-side and back-side structures FST and BST of the first core chip 100A may include the same components as those of the front-side and back-side structures FST and BST of the second core chip 100B. The first core chip 100A may have a structure vertically symmetrical with that of the second core chip 100B. The following will representatively discuss the front-side structure FST and the back-side structure BST of the second core chip 100B.

Referring to FIG. 2, the second core chip 100B may include the back-side structure BST and the front-side structure FST on the back-side structure BST. The back-side structure BST may include an inactive section IACP of a substrate SUB which will be discussed below. The front-side structure FST may include a below-described active section ACP of the substrate SUB, a front-end-of-line structure FEOL, and a metal layer MEL (e.g., metal-containing layer).

The second core chip 100B may include the substrate SUB, and may also include the front-end-of-line structure FEOL and the metal layer MEL that are on the substrate SUB. The substrate SUB may have a first surface SUBa and a second surface SUBb opposite to the first surface SUBa. The substrate SUB may include an active section ACP adjacent to the first surface SUBa and an inactive section IACP adjacent to the second surface SUBb. The active section ACP may include a plurality of transistors that constitute an integrated circuit. The inactive section IACP of the substrate SUB may constitute the back-side structure BST of the second core chip 100B. The front-side structure FST may be constituted by the active section ACP of the substrate SUB, the front-end-of-line structure FEOL, and the metal layer MEL The front-end-of-line structure FEOL may be on the active section ACP of the substrate SUB. In an implementation, a plurality of source/drain patterns SD may be in the active section ACP of the substrate SUB. A plurality of gate electrodes GE may be on the active section ACP. In an implementation, the plurality of gate electrodes GE may be on the first surface SUBa of the substrate SUB. Each of the gate electrodes GE may be between a pair of neighboring source/drain patterns SD. A plurality of transistors may be constituted by the gate electrodes GE and the active section ACP that includes the source/drain patterns SD.

A plurality of active contacts AC may connect to corresponding source/drain patterns SD. In an implementation, a plurality of gate contacts may be further provided to connect to corresponding gate electrodes GE.

The aforementioned transistors and contacts on the active section ACP may be formed through a front-end-of-line process of fabrication for the second core chip 100B. In an implementation, the transistors and the contacts may constitute the front-end-of-line structure FEOL of the second core chip 100B.

The metal layer MEL may be on the front-end-of-line structure FEOL. The metal layer MEL may include a plurality of metal layers M1, M2, . . . , and Mt that are sequentially stacked. In an implementation, a first metal layer M1 at bottom of the metal layer MEL may include first lines IL1 and first vias VI1 below the first lines IL1. The first lines IL1 may be connected through the first vias VI1 to the active contacts AC of the front-end-of-line structure FEOL. A second metal layer M2 on the first metal layer M1 may include second lines IL2 and second vias VI2 below the second lines IL2. The second lines IL2 may be connected through the second vias VI2 to the first lines IL1.

An uppermost metal layer Mt in the metal layer MEL may include at least one pad PAD and an uppermost via VIt below the pad PAD. A plurality of metal layers may be between the second metal layer M2 and the uppermost metal layer Mt, and a suitable number of the metal layers may be included.

The pad PAD at top of the metal layer MEL may be exposed on or at a top surface of the second core chip 100B. The pad PAD may be connected to at least one of first upper lines PIL1 which will be discussed below, on a bottom surface of the first upper redistribution layer PRDL1. The second core chip 100B may be electrically connected through the pad PAD to the first upper redistribution layer PRDL1.

The lines, the vias, and the pad PAD of the metal layer MEL may each include at least one metal, e.g., aluminum, copper, tungsten, molybdenum, or cobalt. In an implementation, the first and second lines IL1 and IL2 may include, e.g., copper, and the pad PAD may include, e.g., aluminum.

Each of the first and second core chips 100A and 100B may include a logic chip, a buffer chip, or a system-on-chip (SOC). In an implementation, the first and second core chips 100A and 100B may be an application specific integrated circuit (ASIC) chip or an application processor (AP) chip. The ASIC chip may include an application specific integrated circuit (ASIC). The first and second core chips 100A and 100B may include a central processing unit (CPU) or a graphic processing unit (GPU).

Referring back to FIG. 1, the first through vias TSV1 may penetrate from top to bottom surfaces of the first core semiconductor stack CST1. The first through vias TSV1 may have their bottom surface electrically connected to the first lower lines NIL1 at the top surface of the first lower redistribution layer NRDL1. The first through vias TSV1 may have their top surfaces electrically connected to first upper lines PIL1 which will be discussed below, at the bottom surface of the first upper redistribution layer PRDL1. The front-side structures FST of the first and second core chips 100A and 100B may be electrically connected to each other through the first through vias TSV1. In an implementation, the first core chip 100A may be electrically connected to the second core chip 100B through the first lower redistribution layer NRDL1, the first through vias TSV1, and the first upper redistribution layer PRDL1. The first through vias TSV1 may include a conductive metallic material, e.g., copper (Cu), aluminum (Al), tungsten (W), or titanium (Ti).

The first memory semiconductor stack MST1 may be mounted on the first lower redistribution layer NRDL1. The first memory semiconductor stack MST1 may be horizontally or laterally spaced apart from the first core semiconductor stack CST1. The first memory semiconductor stack MST1 may have a top surface coplanar with that of the first core semiconductor stack CST1. In an implementation, the first core semiconductor stack CST1 and the first memory semiconductor stack MST1 may have heights that are substantially the same as each other (e.g., as measured in a vertical direction from the first lower redistribution layer NRDL1). In an implementation, the first memory semiconductor stack MST1 may have an area of about 25 square millimeters (5 mm×5 mm) to 225 square millimeters (15 mm×15 mm).

The first memory semiconductor stack MST1 may include first, second, third, and fourth memory chips 200A, 200B, 200C, and 200D that are sequentially stacked. The first, second, third, and fourth memory chips 200A, 200B, 200C, and 200D may be of a different type from the first and second core chips 100A and 100B. The first, second, third, and fourth memory chips 200A, 200B, 200C, and 200D may be memory chips. The memory chips may include high bandwidth memory (HBM) chips. In an implementation, the first, second, third, and fourth memory chips 200A, 200B, 200C, and 200D may include dynamic random access memory (DRAM) chips. In an implementation, there may be a large variation in the number of core chips and memory chips to allow the first core semiconductor stack CST1 to have the same height as that of the first memory semiconductor stack MST1.

Each of the first, second, third, and fourth memory chips 200A, 200B, 200C, and 200D may include a chip substrate CSB, a chip dielectric layer CPI, integrated circuits, and chip vias CSV. The chip dielectric layer CPI may be on a bottom surface of the chip substrate CSB. In an implementation, the integrated circuits may be in the chip dielectric layer CPI. The chip dielectric layer CPI may have chip lines CPL therein.

The chip vias CSV may penetrate the chip substrate CSB to electrically connect to the chip lines CPL. The first, second, third, and fourth memory chips 200A, 200B, 200C, and 200D may be electrically connected to each other through the chip vias CSV and the chip lines CPL.

The first memory chip 200A (at a bottom of the first memory semiconductor stack MST1, e.g., proximate to the first lower redistribution layer NRDL1) may be electrically connected to the first lower redistribution layer NRDL1. The first, second, third, and fourth memory chips 200A, 200B, 200C, and 200D may be electrically connected through the chip vias CSV, the chip lines CPL, and the first lower redistribution layer NRDL1 to the first and second core chips 100A and 100B of the first core semiconductor stack CST1. In an implementation, the fourth memory chip 200D at top of the first memory semiconductor stack MST1 may not include the chip vias CSV.

The fourth memory chip 200D at top of the first memory semiconductor stack MST1 may be electrically connected to the first upper redistribution layer PRDL1. The first, second, third, and fourth memory chips 200A, 200B, 200C, and 200D may be electrically connected through the chip vias CSV, the chip lines CPL, and the first upper redistribution layer PRDL1 to the first and second core chips 100A and 100B of the first core semiconductor stack CST1.

A first molding layer MOL1 may be on the first lower redistribution layer NRDL1. The first molding layer MOL1 may cover the top surface of the first lower redistribution layer NRDL1, a sidewall of the first core semiconductor stack CST1, and a sidewall of the first memory semiconductor stack MST1. The first molding layer MOL1 may have a top surface coplanar with that of the first core semiconductor stack CST1 and that of the first memory semiconductor stack MST1. The first molding layer MOL1 may expose (e.g., may not cover) the top surface of the first core semiconductor stack CST1 and the top surface of the first memory semiconductor stack MST1. The first molding layer MOL1 may include a dielectric polymer, e.g., an epoxy molding compound (EMC).

The first upper redistribution layer PRDL1 may be on the first core semiconductor stack CST1 and the first memory semiconductor stack MST1. The first upper redistribution layer PRDL1 may include first upper lines PIL1 and a first upper dielectric layer PIN1. The first upper lines PIL1 may be in the first upper dielectric layer PIN1. In an implementation, the first upper redistribution layer PRDL1 may have an area of about 400 square millimeters (20 mm×20 mm) to 1,600 square millimeters (40 mm×40 mm).

The first upper lines PIL1 may include a conductive metallic material, e.g., copper (Cu), aluminum (Al), tungsten (W), or titanium (Ti). The first upper dielectric layer PIN1 may include, e.g., silicon nitride, silicon oxide, or silicon oxynitride.

One (or more) of the first upper lines PIL1 exposed at a bottom surface of the first upper redistribution layer PRDL1 may be electrically connected to the first core semiconductor stack CST1. Another one (or more) of the first upper lines PIL1 exposed at the bottom surface of the first upper redistribution layer PRDL1 may be electrically connected to the first memory semiconductor stack MST1. The first core semiconductor stack CST1 and the first memory semiconductor stack MST1 may be electrically connected to each other through the first upper lines PIL1 of the first upper redistribution layer PRDL1.

The second package PKG2 may be on the first package PKG1. The second package PKG2 may include a second lower redistribution layer NRDL2, a second core semiconductor stack CST2 on the second lower redistribution layer NRDL2, a second memory semiconductor stack MST2 on the second lower redistribution layer NRDL2, and a second upper redistribution layer PRDL2 at top of the second package PKG2. In an implementation, the second package PKG2 may have an area of about 400 square millimeters (20 mm×20 mm) to 1,600 square millimeters (40 mm×40 mm).

The second lower redistribution layer NRDL2 may be on the first upper redistribution layer PRDL1. The second lower redistribution layer NRDL2 may include second lower lines NIL2 and a second lower dielectric layer NIN2. The second lower lines NIL2 may be in the second lower dielectric layer NIN2. In an implementation, the second lower redistribution layer NRDL2 may have an area of about 400 square millimeters (20 mm×20 mm) to 1,600 square millimeters (40 mm×40 mm).

The second lower lines NIL2 may include a conductive metallic material, e.g., copper (Cu), aluminum (Al), tungsten (W), or titanium (Ti). The second lower dielectric layer NIN2 may include, e.g., silicon nitride, silicon oxide, or silicon oxynitride.

One (or more) of the second lower lines NIL2 exposed at a top surface of the second lower redistribution layer NRDL2 may be electrically connected to the second core semiconductor stack CST2. Another one (or more) of the second lower lines NIL2 exposed at the top surface of the second lower redistribution layer NRDL2 may be electrically connected to the second memory semiconductor stack MST2. The second core semiconductor stack CST2 and the second memory semiconductor stack MST2 may be electrically connected to each other through the second lower lines NIL2 of the second lower redistribution layer NRDL2.

One (or more) of the second lower lines NIL2 may be electrically connected to uppermost first upper lines PIL1 of the first upper redistribution layer PRDL1. The first upper redistribution layer PRDL1 may be electrically connected to the second lower redistribution layer NRDL2. The first package PKG1 and the second package PKG2 may be electrically connected to each other through the first upper redistribution layer PRDL1 and the second lower redistribution layer NRDL2. In an implementation, the first upper redistribution layer PRDL1 may be indistinguishable from (e.g., continuous or monolithic with) the second lower redistribution layer NRDL2.

The second core semiconductor stack CST2 may be mounted on the second lower redistribution layer NRDL2. The second core semiconductor stack CST2 may include a third core chip 100C, a fourth core chip 100D on the third core chip 100C, and second through vias TSV2. In an implementation, the second core semiconductor stack CST2 may have an area of about 25 square millimeters (5 mm×5 mm) to 225 square millimeters (15 mm×15 mm).

The third and fourth core chips 100C and 100D may be of the same type as the first and second core chips 100A and 100B. In an implementation, the first and second core semiconductor stacks CST1 and CST2 may perform the same operation. The third and fourth core chips 100C and 100D may be of a different type from the first and second core chips 100A and 100B. In an implementation, the first and second core semiconductor stacks CST1 and CST2 may perform different operations. In an implementation, the first and second core chips 100A and 100B may include a central processing unit (CPU), and the third and fourth core chips 100C and 100D may include a graphic processing unit (GPU).

The second through vias TSV2 may penetrate from top to bottom surfaces of the second core semiconductor stack CST2. The second through vias TSV2 may have bottom surfaces electrically connected to the second lower lines NIL2 at the top surface of the second lower redistribution layer NRDL2. The second through vias TSV2 may have top surfaces electrically connected to second upper lines PIL2, which will be discussed below, at a bottom surface of the second upper redistribution layer PRDL2. The third and fourth core chips 100C and 100D may have active surfaces that are electrically connected to each other through the second through vias TSV2. The third core chip 100C and the fourth core chip 100D may be electrically connected to each other through the second through vias TSV2. In an implementation, the third core chip 100C may be electrically connected to the fourth core chip 100D through the second lower redistribution layer NRDL2, the second through vias TSV2, and the second upper redistribution layer PRDL2. The second through vias TSV2 may include a conductive metallic material, e.g., copper (Cu), aluminum (Al), tungsten (W), or titanium (Ti).

The second memory semiconductor stack MST2 may be mounted on the second lower redistribution layer NRDL2. The second memory semiconductor stack MST2 may be horizontally spaced apart from the second core semiconductor stack CST2. The second memory semiconductor stack MST2 may have a top surface coplanar with that of the second core semiconductor stack CST2. In an implementation, the second core semiconductor stack CST2 and the second memory semiconductor stack MST2 may have heights that are substantially the same as each other (e.g., as measured from the second lower redistribution layer NRDL2 in the vertical direction). In an implementation, the second memory semiconductor stack MST2 may have an area of about 25 square millimeters (5 mm×5 mm) to 225 square millimeters (15 mm×15 mm).

The second memory semiconductor stack MST2 may include fifth, sixth, seventh, and eighth memory chips 200E, 200F, 200G, and 200H that are sequentially stacked. The fifth, sixth, seventh, and eighth memory chips 200E, 200F, 200G, and 200H may be of a different type from core chips (e.g., the third and fourth core chips 100C and 100D). The fifth, sixth, seventh, and eighth memory chips 200E, 200F, 200G, and 200H may be of the same type as the first, second, third, and fourth memory chips 200A, 200B, 200C, and 200D. The memory chips may include high bandwidth memory (HBM) chips. For example, the fifth, sixth, seventh, and eighth memory chips 200E, 200F, 200G, and 200H may be dynamic random access memory (DRAM) chips.

The fifth memory chip 200E at bottom of the second memory semiconductor stack MST2 may be electrically connected to the second lower redistribution layer NRDL2. The fifth, sixth, seventh, and eighth memory chips 200E, 200F, 200G, and 200H may be electrically connected through the chip vias CSV, the chip lines CPL, and the second lower redistribution layer NRDL2 to the third and fourth core chips 100C and 100D of the second core semiconductor stack CST2. In an implementation, the eighth memory chip 200H at top of the second memory semiconductor stack MST2 may not include the chip vias CSV.

The eighth memory chip 200H at a top end of the second memory semiconductor stack MST2 may be electrically connected to the second upper redistribution layer PRDL2 which will be discussed below. The fifth, sixth, seventh, and eighth memory chips 200E, 200F, 200G, and 200H may be electrically connected through the chip vias CSV, the chip lines CPL, and the second upper redistribution layer PRDL2 to the third and fourth core chips 100C and 100D of the second core semiconductor stack CST2.

A second molding layer MOL2 may be on the second lower redistribution layer NRDL2. The second molding layer MOL2 may cover the top surface of the second lower redistribution layer NRDL2, a sidewall of the second core semiconductor stack CST2, and a sidewall of the second memory semiconductor stack MST2. The second molding layer MOL2 may expose the top surface of the second core semiconductor stack CST2 and the top surface of the second memory semiconductor stack MST2.

The second upper redistribution layer PRDL2 may be on the second core semiconductor stack CST2 and the second memory semiconductor stack MST2. The second upper redistribution layer PRDL2 may include second upper lines PIL2 and a second upper dielectric layer PIN2. The second upper lines PIL2 may be in the second upper dielectric layer PIN2. In an implementation, the second upper redistribution layer PRDL2 may have an area of about 400 square millimeters (20 mm×20 mm) to 1,600 square millimeters (40 mm×40 mm).

The second upper lines PIL2 may include a conductive metallic material, e.g., copper (Cu), aluminum (Al), tungsten (W), or titanium (Ti). The second upper dielectric layer PIN2 may include, e.g., silicon nitride, silicon oxide, or silicon oxynitride.

One (or more) of the second upper lines PIL2 exposed at the bottom surface of the second upper redistribution layer PRDL2 may be electrically connected to the second core semiconductor stack CST2. Another one (or more) of the second upper lines PIL2 exposed on the bottom surface of the second upper redistribution layer PRDL2 may be electrically connected to the second memory semiconductor stack MST2. The second core semiconductor stack CST2 and the second memory semiconductor stack MST2 may be electrically connected to each other through the second upper lines PIL2 of the second upper redistribution layer PRDL2.

In an implementation, the second package PKG2 may further include an additional package including one or more of a core semiconductor stack and a memory semiconductor stack, and in this case, there may be a variation in the number of core chips and the number of memory chips.

In some other devices, neither the first upper redistribution layer PRDL1 nor the second lower redistribution layer NRDL2 may be included between the first core semiconductor stack CST1 and the second core semiconductor stack CST2 and between the first memory semiconductor stack MST1 and the second memory semiconductor stack MST2. In this case, e.g., an uppermost memory chip (e.g., the eighth memory chip 200H) of memory semiconductor stacks may be connected to core chips of core semiconductor stacks essentially through the chip vias CSV of the first to seventh memory chips 200A to 200G and through the first lower redistribution layer NRDL1. Therefore, when there is an increase in the number of memory chips of a memory semiconductor stack, there may be an increase in (e.g., a length of a) path between core chips and a memory chip at top of the memory semiconductor stack, which may result in a limitation in bandwidth. In addition, an increase in signal transmission path from the memory chip to the core chip may induce the occurrence of noise on the signal transmission path, and thus signal transmission may become inaccurate.

In contrast, according to some embodiments, one of the second lower redistribution layer NRDL2 and the first upper redistribution layer PRDL1 may be between the first core semiconductor stack CST1 and the second core semiconductor stack CST2 or between the first memory semiconductor stack MST1 and the second memory semiconductor stack MST2. Therefore, the fifth, sixth, seventh, and eighth memory chips 200E, 200F, 200G, and 200H of the second memory semiconductor stack MST2 may be connected through the second lower redistribution layer NRDL2 to the third core chip 100C or the fourth core chip 100D. In an implementation, signals may be exchanged between the fifth to eighth memory chips 200E to 200H and the third and fourth core chips 100C and 100D without through the first lower redistribution layer NRDL1. Therefore, there may be a reduction in (e.g., a length of a) connection path between core semiconductor stacks and memory chips of the second memory semiconductor stack MST2. In an implementation, there may be a reduction in connection path between memory chips and core chips, and a semiconductor device may increase in bandwidth and decrease in signal interruption noise.

According to an embodiment, a memory semiconductor stack or a core semiconductor stack may be additionally stacked vertically and repeatedly on a semiconductor device. Accordingly, even when a semiconductor stack is additionally provided, it may be possible to maintain a horizontal area that the semiconductor device occupies on the package substrate PSUB.

In brief, the embodiments may allow the semiconductor device not only to have a certain area on the package substrate PSUB, but also to achieve high bandwidth by repeatedly stacking the core semiconductor stack and the memory semiconductor stack.

Figure 3:
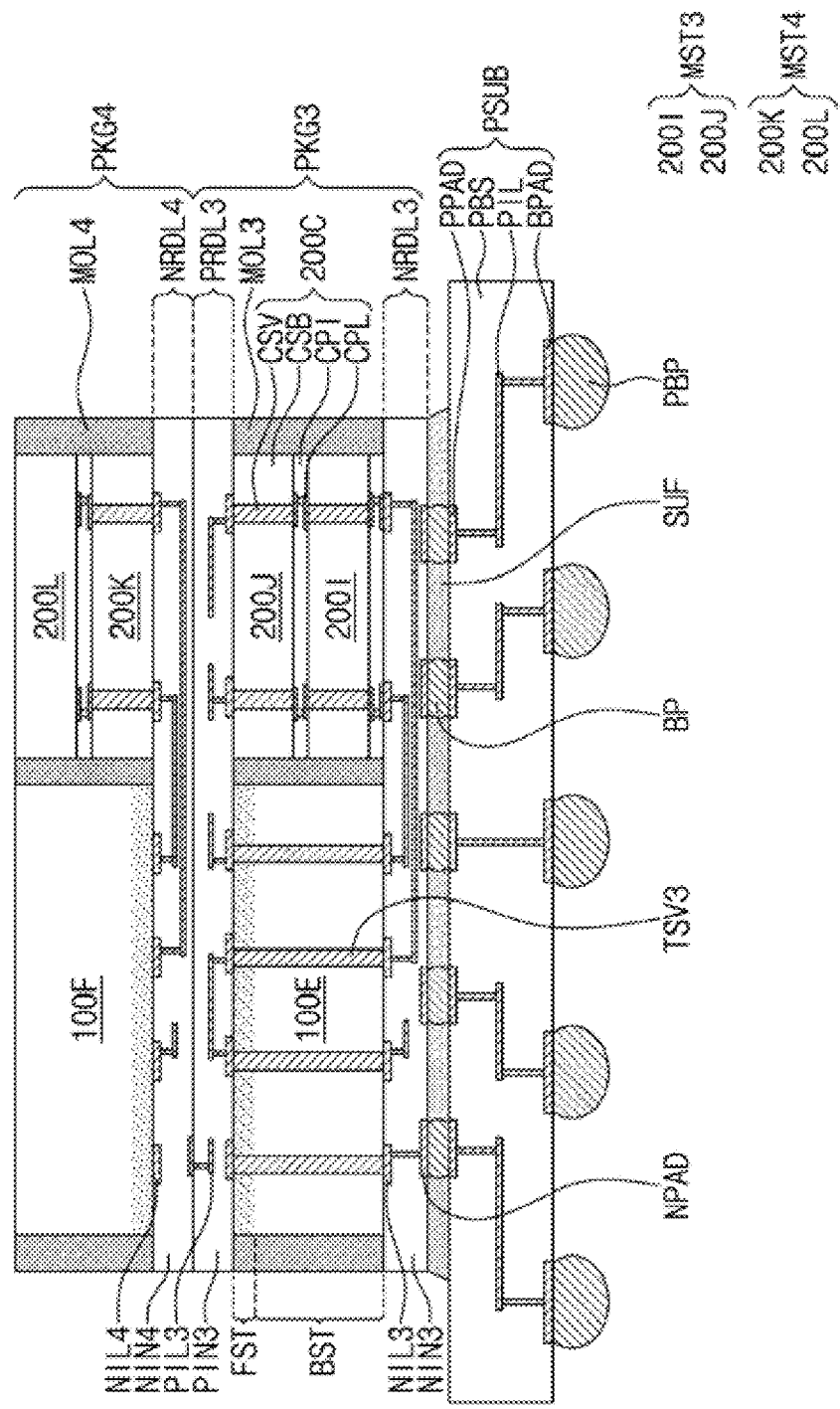
FIGS. 3 and 4 illustrate cross-sectional views of a semiconductor device according to some embodiments.

FIG. 3 illustrates a cross-sectional view of a semiconductor device according to some embodiments. In the embodiment that follows, repeated descriptions of the same features as those discussed in FIGS. 1 and 2 may be omitted, and a difference thereof will be described in detail.

Referring to FIG. 3, a semiconductor device according to some embodiments may include a third package PKG3 on a package substrate PSUB and a fourth package PKG4 on the third package PKG3. Substrate bumps BP and a substrate under-fill layer SUF may be between the package substrate PSUB and the third package PKG3. The package substrate PSUB may include external terminals PBP on a bottom surface thereof.

The third package PKG3 may be on the package substrate PSUB. The third package PKG3 may include a third lower redistribution layer NRDL3, a fifth core chip 100E on the third lower redistribution layer NRDL3, third through vias TSV3, a third memory semiconductor stack MST3 on the third lower redistribution layer NRDL3, and a third upper redistribution layer PRDL3 at top of the third package PKG3.

The third lower redistribution layer NRDL3 may be on the package substrate PSUB. The third lower redistribution layer NRDL3 may include third lower lines NIL3, lower pads NPAD, and a third lower dielectric layer NIN3. The third lower lines NIL3 may be in the third lower dielectric layer NIN3.

The third lower lines NIL3 and the lower pads NPAD may include a conductive metallic material, e.g., copper (Cu), aluminum (Al), tungsten (W), or titanium (Ti). The third lower dielectric layer NIN3 may include, e.g., silicon nitride, silicon oxide, or silicon oxynitride.

One (or more) of the third lower lines NIL3 exposed at a top surface of the third lower redistribution layer NRDL3 may be electrically connected to the fifth core chip 100E. Another one (or more) of the third lower lines NIL3 exposed at the top surface of the third lower redistribution layer NRDL3 may be electrically connected to the third memory semiconductor stack MST3. The fifth core chip 100E and the third memory semiconductor stack MST3 may be electrically connected to each other through the third lower lines NIL3 of the third lower redistribution layer NRDL3.

The fifth core chip 100E may be mounted on the third lower redistribution layer NRDL3. The fifth core chip 100E may include a front-side structure FST and a back-side structure BST. The front-side structure FST and the back-side structure BST of the fifth core chip 100E may have configurations substantially the same as those of the front-side structure FST and the back-side structure BST of the second core chip 100B.

The third through vias TSV3 may penetrate from top to bottom surfaces of the fifth core chip 100E. The third through vias TSV3 may have bottom surfaces electrically connected to the third lower lines NIL3 on the top surface of the third lower redistribution layer NRDL3. The third through vias TSV3 may have top surfaces electrically connected to third upper lines PIL3, which will be discussed below, on a bottom surface of the third upper redistribution layer PRDL3. The third through vias TSV3 may include a conductive metallic material, e.g., copper (Cu), aluminum (Al), tungsten (W), or titanium (Ti).

The third memory semiconductor stack MST3 may be mounted on the third lower redistribution layer NRDL3. The third memory semiconductor stack MST3 may be horizontally spaced apart from the fifth core chip 100E. The third memory semiconductor stack MST3 may have a top surface coplanar with that of the fifth core chip 100E. In an implementation, the fifth core chip 100E and the third memory semiconductor stack MST3 may have their heights that are substantially the same as each other (e.g., as measured from the third lower redistribution layer NRDL3 in the vertical direction).

The third memory semiconductor stack MST3 may include ninth and tenth memory chips 200I and 200J that are sequentially stacked. In an implementation, the number of memory chips may be varied to allow the fifth core chip 100E to have the same height as that of the third memory semiconductor stack MST3.

Each of the ninth and tenth memory chips 200I and 200J may include a chip substrate CSB, a chip dielectric layer CPI, integrated circuits, and chip vias CSV. The chip dielectric layer CPI may be on a bottom surface of the chip substrate CSB. The chip vias CSV may penetrate the chip substrate CSB to electrically connect to chip lines CPL. The ninth and tenth memory chips 200I and 200J may be electrically connected to each other through the chip vias CSV and the chip lines CPL.

The ninth memory chip 200I at a lower portion the third memory semiconductor stack MST3 may be electrically connected to the third lower redistribution layer NRDL3. The ninth and tenth memory chips 200I and 200J may be electrically connected to the fifth core chip 100E through the chip vias CSV, the chip lines CPL, and the third lower redistribution layer NRDL3. In an implementation, the tenth memory chip 200J at top of the third memory semiconductor stack MST3 may not include the chip vias CSV.

The tenth memory chip 200J disposed at an upper portion of the third memory semiconductor stack MST3 may be electrically connected to the third upper redistribution layer PRDL3. The ninth and tenth memory chips 200I and 200J may be electrically connected to the fifth core chip 100E through the chip vias CSV, the chip lines CPL, and the third upper redistribution layer PRDL3.

A third molding layer MOL3 may be on the third lower redistribution layer NRDL3. The third molding layer MOL3 may cover the top surface of the third lower redistribution layer NRDL3, a sidewall of the fifth core chip 100E, and a sidewall of the third memory semiconductor stack MST3. The third molding layer MOL3 may have a top surface coplanar with that of the first core chip 100E and that of the third memory semiconductor stack MST3. The third molding layer MOL3 may expose the top surface of the fifth core chip 100E and the top surface of the third memory semiconductor stack MST3. The third molding layer MOL3 may include a dielectric polymer, e.g., an epoxy molding compound (EMC).

The third upper redistribution layer PRDL3 may be on the fifth core chip 100E and the third memory semiconductor stack MST3. The third upper redistribution layer PRDL3 may include third upper lines PIL3 and a third upper dielectric layer PIN3. The third upper lines PIL3 may be in the third upper dielectric layer PIN3.

One (or more) of the third upper lines PIL3 exposed at a bottom surface of the third upper redistribution layer PRDL3 may be electrically connected to the fifth core chip 100E. Another one (or more) of the third upper lines PIL3 exposed at the bottom surface of the third upper redistribution layer PRDL3 may be electrically connected to the third memory semiconductor stack MST3. The fifth core chip 100E and the third memory semiconductor stack MST3 may be electrically connected to each other through the third upper lines PIL3 of the third upper redistribution layer PRDL3.

The fourth package PKG4 may be on the third package PKG3. The fourth package PKG4 may include a fourth lower redistribution layer NRDL4, a sixth core chip 100F on the fourth lower redistribution layer NRDL4, and a fourth memory semiconductor stack MST4 on the fourth lower redistribution layer NRDL4.

The fourth lower redistribution layer NRDL4 may be on the third upper redistribution layer PRDL3. The fourth lower redistribution layer NRDL4 may include fourth lower lines NIL4 and a fourth lower dielectric layer NIN4. The fourth lower lines NIL4 may be in the fourth lower dielectric layer NIN4. One (or more) of the fourth lower lines NIL4 may be electrically connected to one or more of uppermost first upper lines PIL3 of the third upper redistribution layer PRDL3. In an implementation, the third upper redistribution layer PRDL3 may be indistinguishable from the fourth lower redistribution layer NRDL4.

One (or more) of the fourth lower lines NIL4 exposed at a top surface of the fourth lower redistribution layer NRDL4 may be electrically connected to the sixth core chip 100F. Another one (or more) of the fourth lower lines NIL4 exposed at the top surface of the fourth lower redistribution layer NRDL4 may be electrically connected to the fourth memory semiconductor stack MST4. The sixth core chip 100F and the fourth memory semiconductor stack MST4 may be electrically connected to each other through the fourth lower lines NIL4 of the fourth lower redistribution layer NRDL4.

The fourth memory semiconductor stack MST4 may be mounted on the fourth lower redistribution layer NRDL4. The fourth memory semiconductor stack MST4 may be horizontally spaced apart from the sixth core chip 100F. The fourth memory semiconductor stack MST4 may have a top surface coplanar with that of the sixth core chip 100F. In an implementation, the sixth core chip 100F and the fourth memory semiconductor stack MST4 may have their heights that are substantially the same as each other.

The fourth memory semiconductor stack MST4 may include eleventh and twelfth memory chips 200K and 200L that are sequentially stacked. The eleventh memory chip 200K may include a chip substrate CSB, a chip dielectric layer CPI, and chip vias CSV. The twelfth memory chip 200L may include no chip vias. In an implementation, the number of memory chips may be varied to allow the sixth core chip 100F to have the same height as that of the fourth memory semiconductor stack MST4.

The eleventh memory chip 200K at a bottom of the fourth memory semiconductor stack MST4 may be electrically connected to the fourth lower redistribution layer NRDL4. The eleventh and twelfth memory chips 200K and 200L may be electrically connected to the sixth core chip 100F through the chip vias CSV, the chip lines CPL, and the fourth lower redistribution layer NRDL4.

The eleventh and twelfth memory chips 200K and 200L may be electrically connected to the sixth core chip 100F through the chip vias CSV, the chip lines CPL, and the fourth lower redistribution layer NRDL4.

A fourth molding layer MOL4 may be on the fourth lower redistribution layer NRDL4. The fourth molding layer MOL4 may cover the top surface of the fourth lower redistribution layer NRDL4, a sidewall of the sixth core chip 100F, and a sidewall of the fourth memory semiconductor stack MST4. The fourth molding layer MOL4 may expose the top surface of the sixth core chip 100F and the top surface of the fourth memory semiconductor stack MST4. Unlike the first, second, and third packages PKG1, PKG2, and PKG3, the fourth package PKG4 may include no upper redistribution layer.

Figure 4:
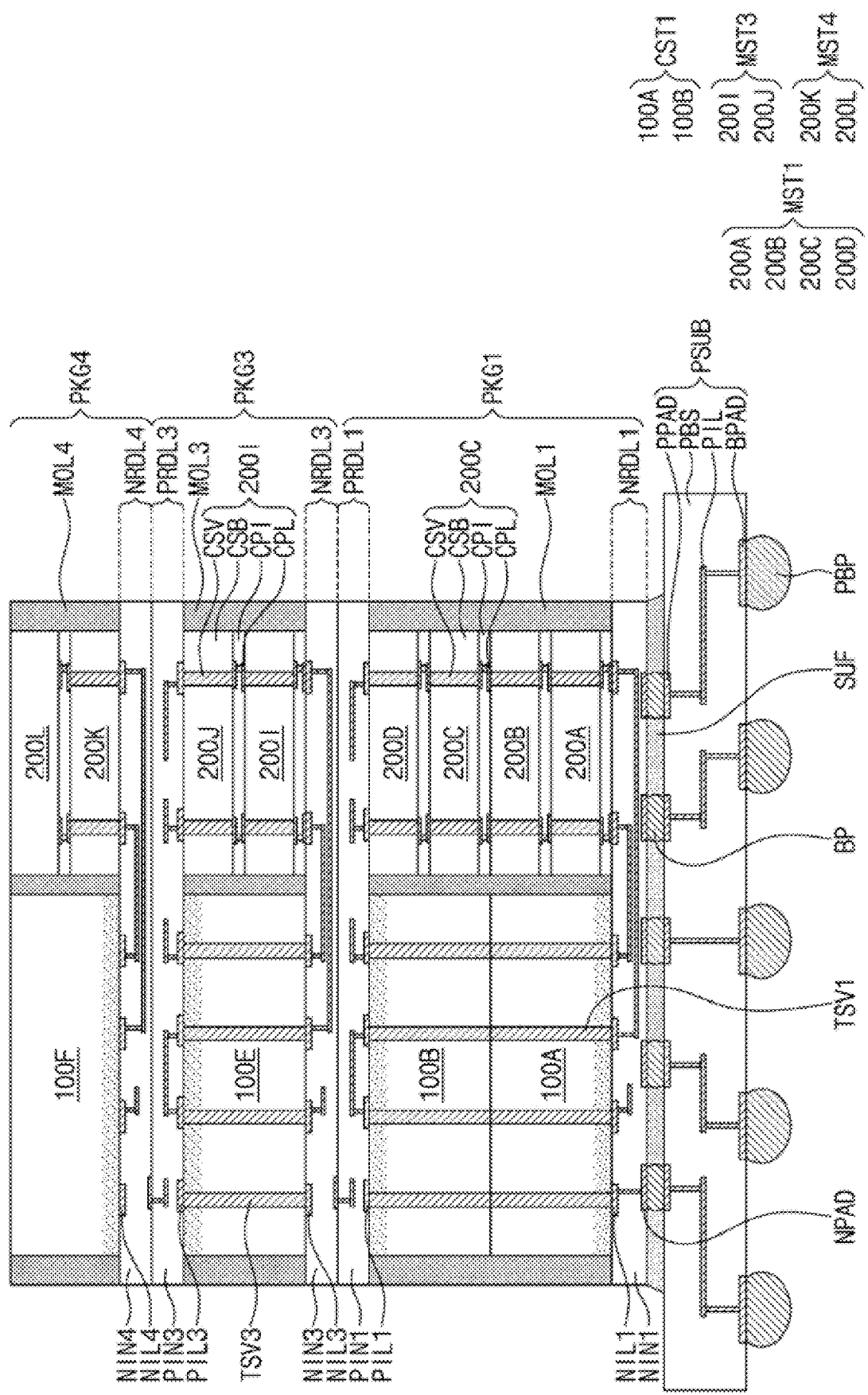

FIG. 4 illustrates a semiconductor device according to some embodiments. In the embodiment that follows, repeated descriptions of the same features as those discussed in FIGS. 1 to 3 may be omitted, and a difference thereof will be described in detail.

Referring to FIG. 4, a semiconductor device according to some embodiments may include a first package PKG1 on a package substrate PSUB, a third package PKG3 on the first package PKG1, and a fourth package PKG4 on the third package PKG3.

The first package PKG1 on the package substrate PSUB may be substantially the same as the first package PKG1 on the package substrate PSUB of the semiconductor device discussed with reference to FIGS. 1 and 2. The third package PKG3 and the fourth package PKG4 on the third package PKG3 may be substantially the same as the third package PKG3 and the fourth package PKG4 on the third package PKG3 of the semiconductor device discussed with reference to FIG. 3.

In an implementation, the semiconductor device according to some embodiments may include the third and fourth packages PKG3 and PKG4 of FIG. 3 provided on the package substrate PSUB and the first package PKG1 of FIG. 1.

FIGS. 5 to 13 illustrate cross-sectional views of stages in a method of fabricating a semiconductor device according to some embodiments. With reference to FIGS. 1 and 5 to 13, the following will describe in detail a method of fabricating a semiconductor device according to an embodiment.

Figure 5:
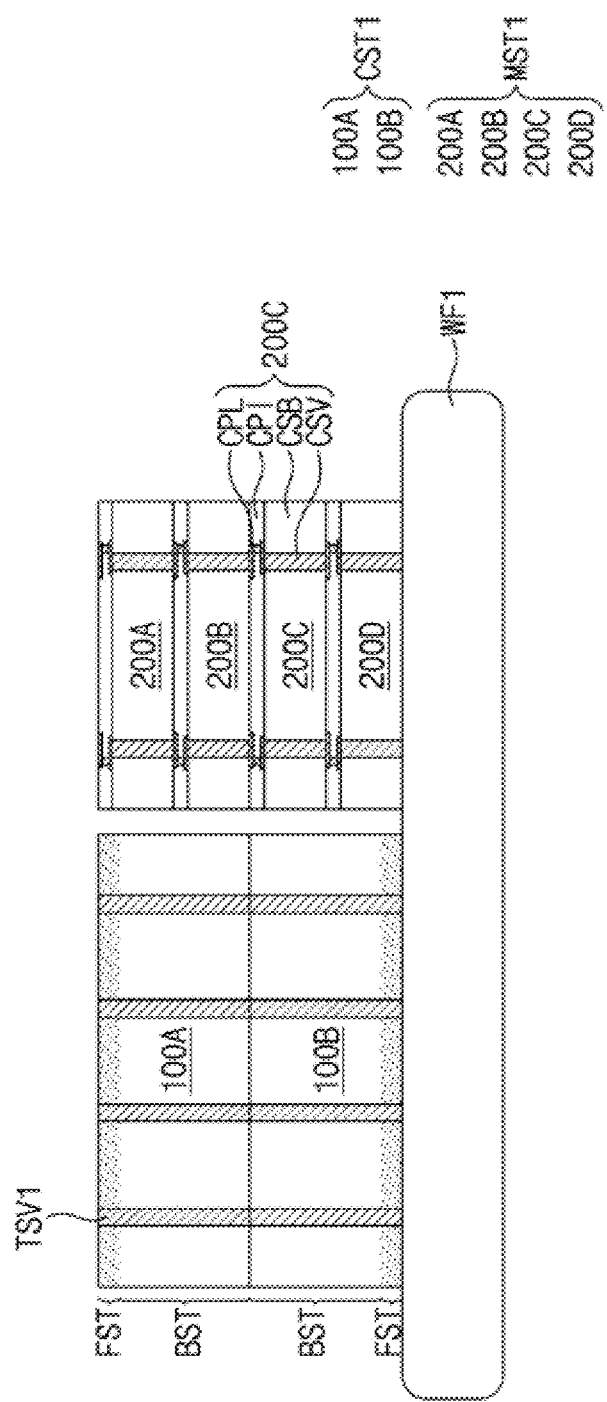
FIGS. 5 to 13 illustrate cross-sectional views of stages in a method of fabricating the semiconductor device of FIG. 1.

Referring to FIG. 5, a first core semiconductor stack CST1 and a first memory semiconductor stack MST1 may be formed on a first wafer WF1. The first memory semiconductor stack MST1 and the first core semiconductor stack CST1 may be horizontally spaced apart from each other on the first wafer WF1. A die-to-wafer process may be performed to form the first core semiconductor stack CST1 and the first memory semiconductor stack MST1 on the first wafer WF1.

The first memory semiconductor stack MST1 and the first core semiconductor stack CST1 may have heights that are substantially the same as each other (e.g., as measured from the first wafer WF1 in the vertical direction). In an implementation, on the first wafer WF1, the first memory semiconductor stack MST1 may have a top surface coplanar with that of the first core semiconductor stack CST1. In an implementation, the number of core chips and memory chips may vary to allow the first core semiconductor stack CST1 to have the same height as that of the first memory semiconductor stack MST1.

The first core semiconductor stack CST1 may include a second core chip 100B, a first core chip 100A formed on the second core chip 100B, and first through vias TSV1 that penetrate the first and second core chips 100A and 100B.

Each of the first and second core chips 100A and 100B may include a front-side structure FST and a back-side structure BST. The front-side structure FST of the second core chip 100B may face the first wafer WF1. The front-side structure FST of the first core chip 100A may be at an upper portion of the first core chip 100A. The back-side structure BST of the first core chip 100A may face the back-side structure BST of the second core chip 100B. The front-side structure FST of the first core chip 100A may be opposite to the front-side structure FST of the second core chip 100B. The front-side and back-side structures FST and BST of the first core chip 100A may include the same components as those of the front-side and back-side structures FST and BST of the second core chip 100B. The first core chip 100A may have a structure vertically symmetrical with that of the second core chip 100B.

The first memory semiconductor stack MST1 may include first, second, third, and fourth memory chips 200A, 200B, 200C, and 200D. The third memory chip 200C, the second memory chip 200B, and the first memory chip 200A may be sequentially stacked on the fourth memory chip 200D.

Each of the first, second, third, and fourth memory chips 200A, 200B, 200C, and 200D may include a chip substrate CSB, a chip dielectric layer CPI, integrated circuits, and chip vias CSV. The chip dielectric layer CPI may be on a top surface of the chip substrate CSB.

Figure 6:
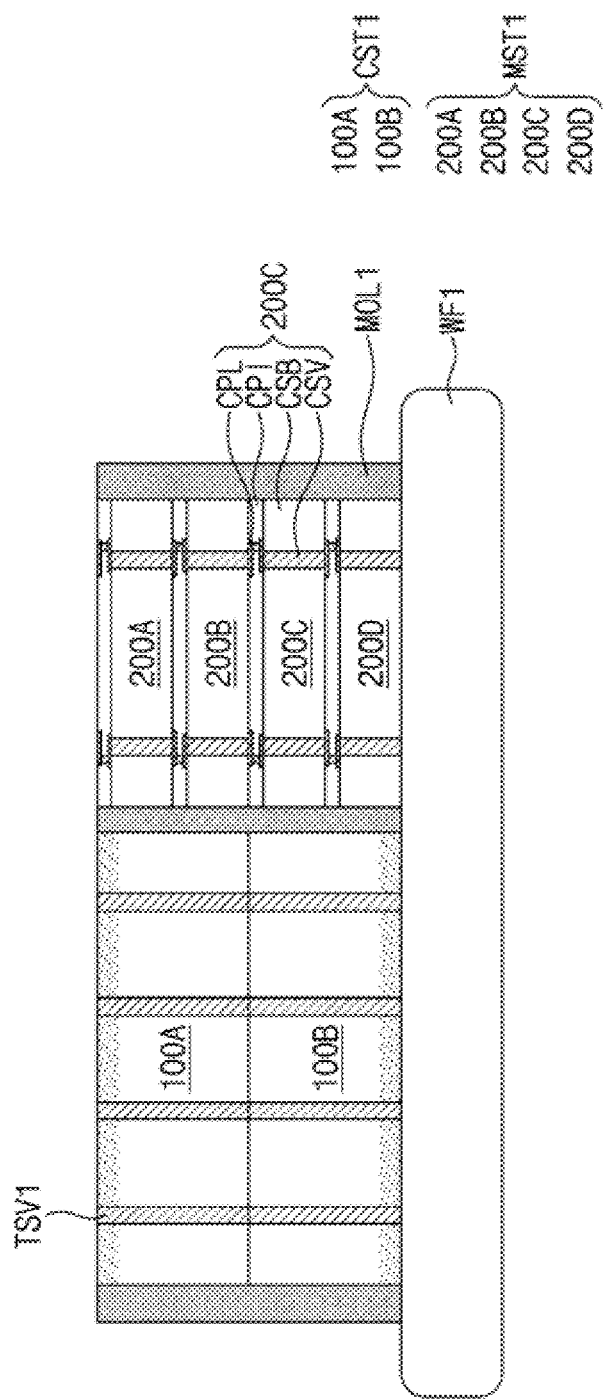

Referring to FIG. 6, a first molding layer MOL1 may be formed on the first wafer WF1. The first molding layer MOL1 may be formed to cover the first core semiconductor stack CST1 and the first memory semiconductor stack MST1. The first molding layer MOL1 may fill a space between the first core semiconductor stack CST1 and the first memory semiconductor stack MST1.

Afterwards, a polishing process may be performed such that the first molding layer MOL1 is polished until the top surface of the first core semiconductor stack CST1 and the top surface of the first memory semiconductor stack MST1 are exposed. The polishing process may include a chemical mechanical polishing (CMP) process. The polishing process may allow the semiconductor stacks CST1 and MST1 to lie at the same level as that of the first molding layer MOL1. In an implementation, the polishing process may cause the semiconductor stacks CST1 and MST1 to become coplanar with the first molding layer MOL1.

Figure 7:
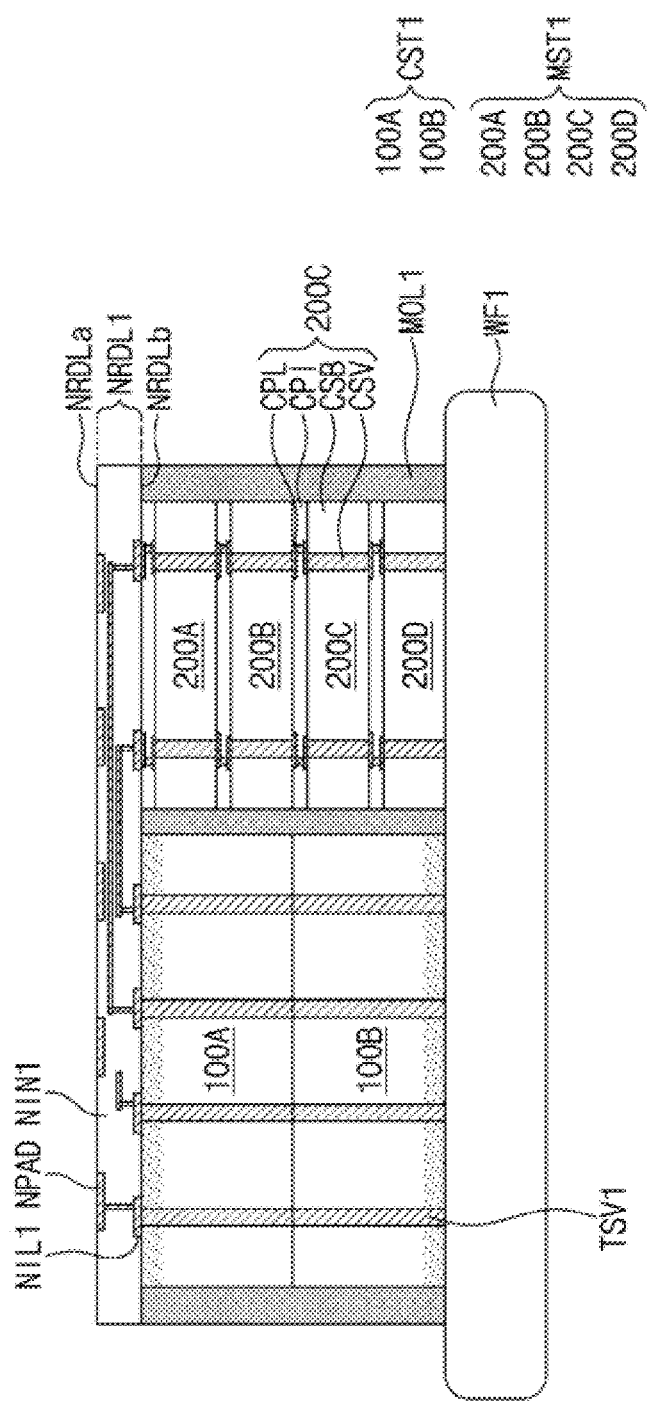

Referring to FIG. 7, a first lower redistribution layer NRDL1 may be formed on a top surface of the first molding layer MOL1 and on the top surfaces of the semiconductor stacks CST1 and MST1.

The formation of the first lower redistribution layer NRDL1 may include forming first lower lines NIL1, a first lower dielectric layer NIN1, and lower pads NPAD.

The first lower redistribution layer NRDL1 may have a first surface NRDLa facing away from the first wafer WF1 and a second surface NRDLb in contact with the semiconductor stacks CST1 and MST1 (e.g., an facing the first wafer WF1). The lower pads NPAD may be on the first surface NRDLa to connect to substrate bumps BP to be formed. One (or more) of the first lower lines NIL1 may be on the second surface NRDLb to electrically connect to the first core semiconductor stack CST1 and the first through vias TSV1. Another one (or more) of the first lower lines NIL1 may be on the second surface NRDLb to electrically connect to the first memory semiconductor stack MST1. The core chips 100A and 100B of the first core semiconductor stack CST1 may be electrically connected through the first lower lines NIL1 to the memory chips 200A, 200B, 200C, and 200D of the first memory semiconductor stack MST1.

Figure 8:
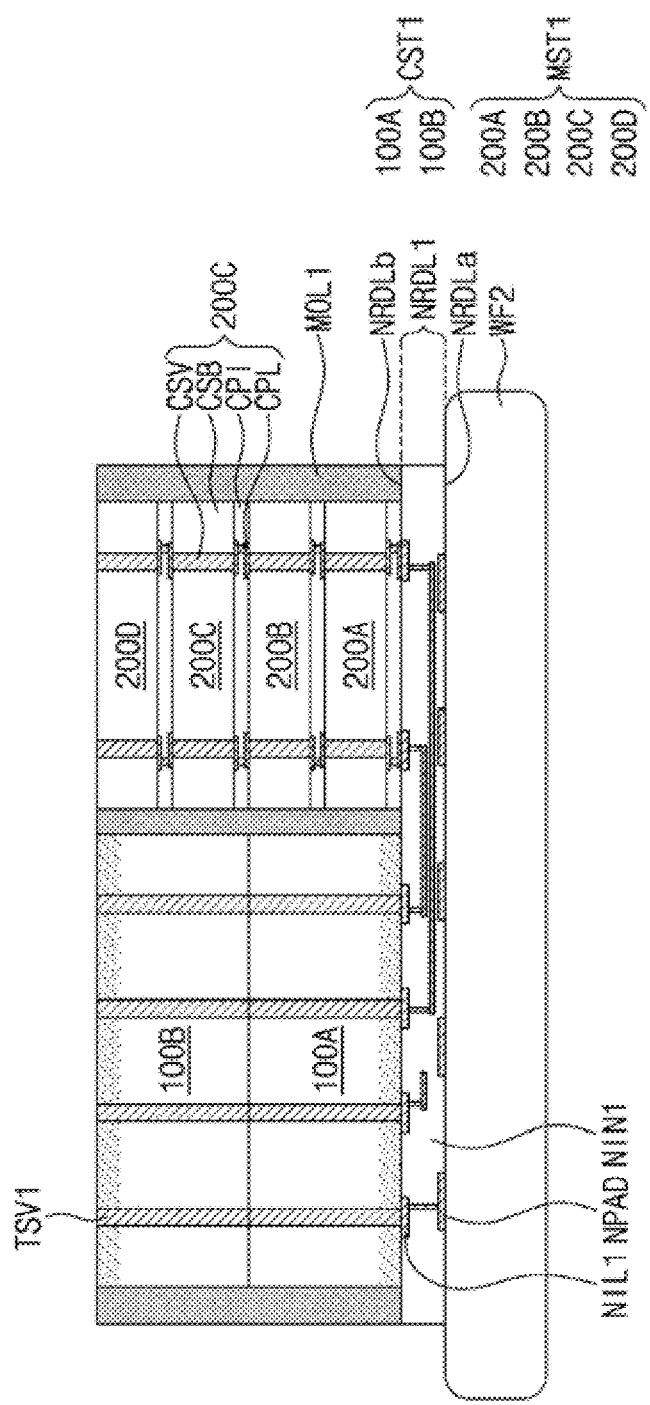

Referring to FIG. 8, a second wafer WF2 may be provided on the first surface NRDLa of the first lower redistribution layer NRDL1. A wafer-to-wafer process may be performed to provide the second wafer WF2. A separation process may be performed to remove the first wafer WF1 on the first molding layer MOL1 and the semiconductor stacks CST1 and MST1. Afterwards, the second wafer WF2 may be flipped to allow the first surface NRDLa of the first lower redistribution layer NRDL1 to face downwardly and to allow the second surface NRDLb of the first lower redistribution layer NRDL1 to face upwardly.

Figure 9:
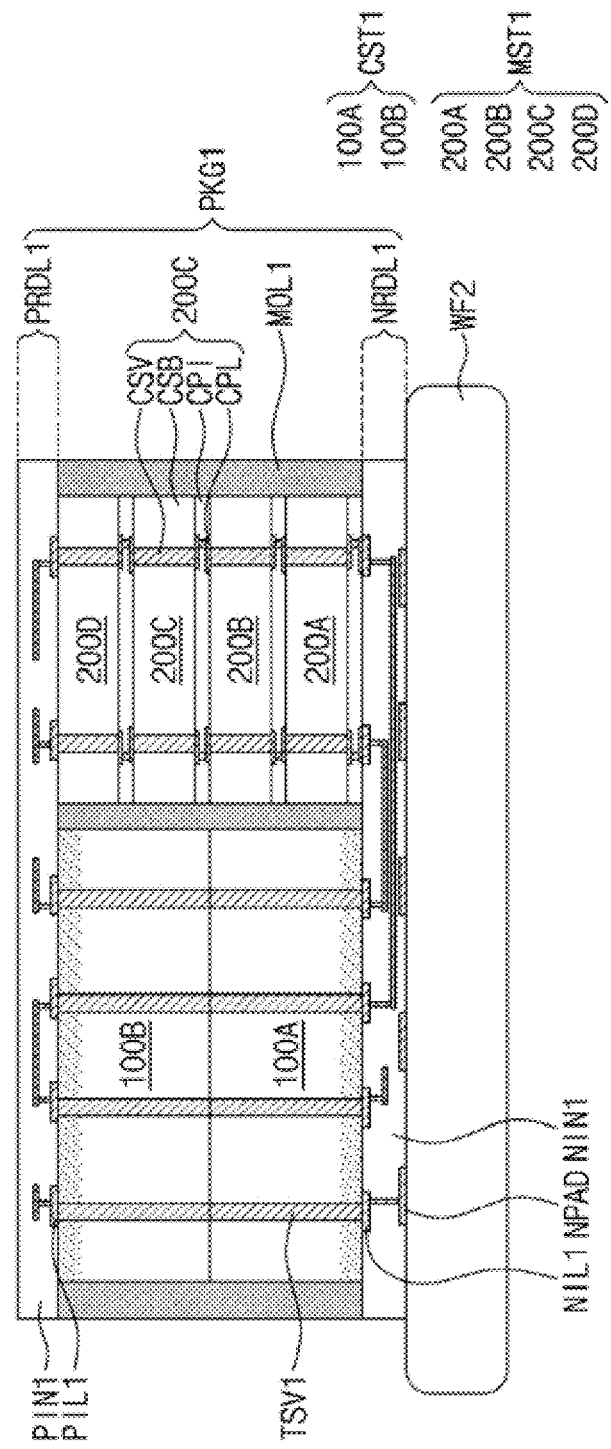

Referring to FIG. 9, a first upper redistribution layer PRDL1 may be formed on the first core semiconductor stack CST1 and the first memory semiconductor stack MST1.

The formation of the first upper redistribution layer PRDL1 may include forming first upper lines PIL1 and a first upper dielectric layer PIN1.

One (or more) of the first upper lines PIL1 exposed at a bottom surface of the first upper redistribution layer PRDL1 may be electrically connected to the first core semiconductor stack CST1. Another one (or more) of the first upper lines PIL1 exposed at the bottom surface of the first upper redistribution layer PRDL1 may be electrically connected to the first memory semiconductor stack MST1. The first core semiconductor stack CST1 and the first memory semiconductor stack MST1 may be electrically connected to each other through the first upper lines PIL1 of the first upper redistribution layer PRDL1.

A first package PKG1 may be constituted by the first lower redistribution layer NRDL1, the first core semiconductor stack CST1, the first memory semiconductor stack MST1, the first molding layer MOL1, and the first upper redistribution layer PRDL1. In an implementation, the processes of FIGS. 5 to 9 may be performed to form the first package PKG1.

Figure 10:
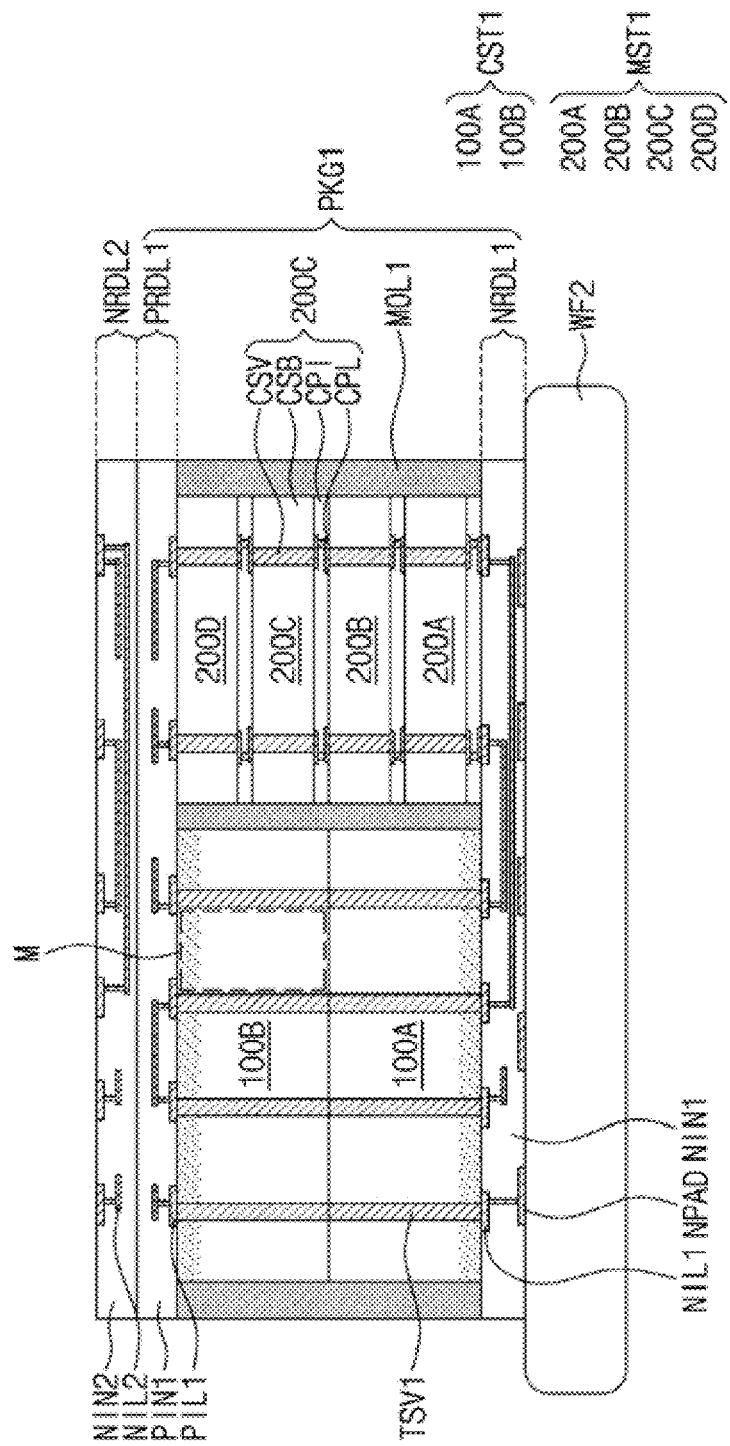

Referring to FIG. 10, a second lower redistribution layer NRDL2 may be formed on the first package PKG1. The formation of the second lower redistribution layer NRDL2 may include forming second lower lines NIL2 and a second lower dielectric layer NIN2.

Figure 11:
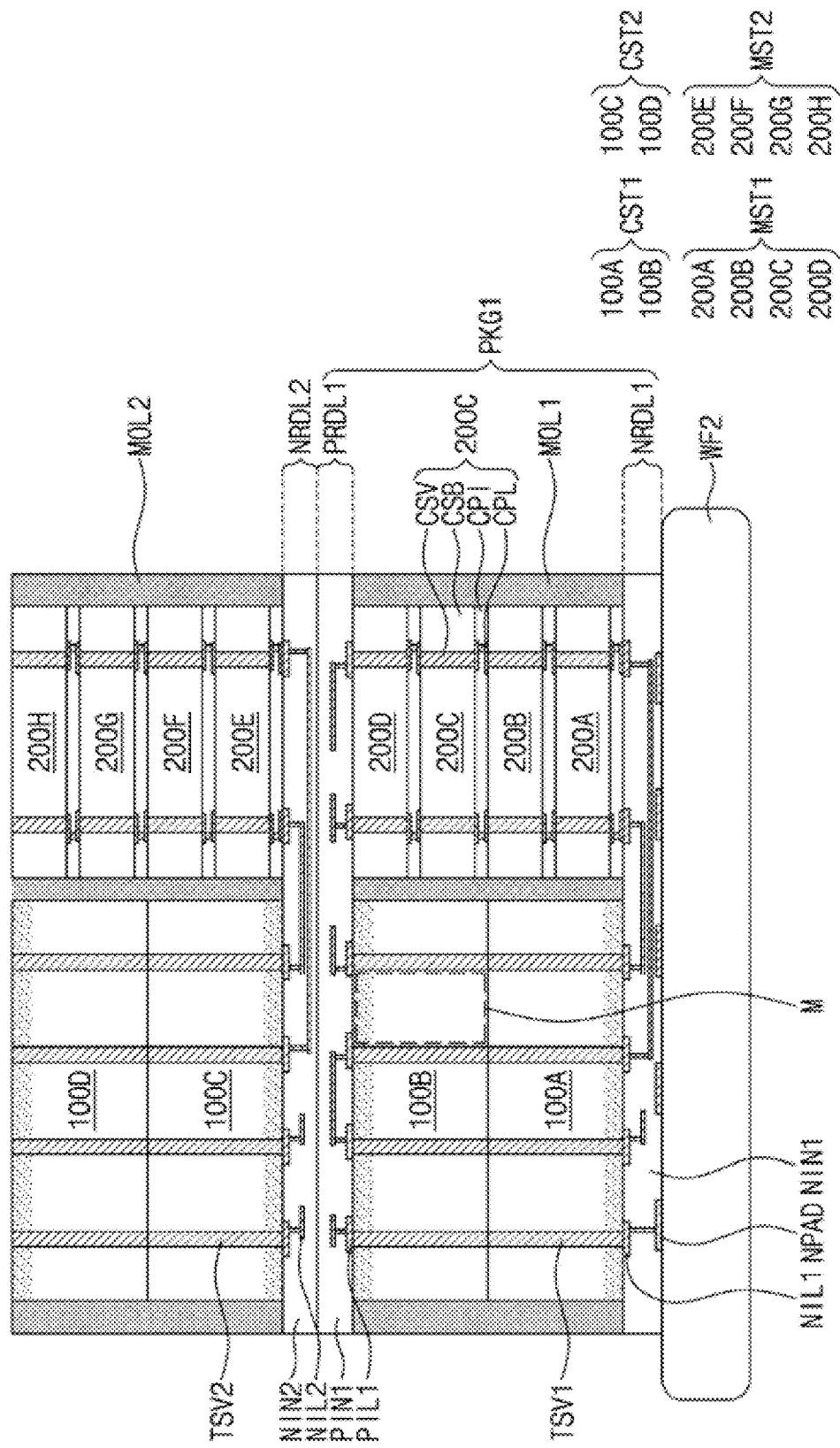

Referring to FIG. 11, a second core semiconductor stack CST2 and a second memory semiconductor stack MST2 may be provided on the second lower redistribution layer NRDL2. The second memory semiconductor stack MST2 may be horizontally spaced apart from the second core semiconductor stack CST2. The second memory semiconductor stack MST2 may have a top surface coplanar with that of the second core semiconductor stack CST2. In an implementation, the second core semiconductor stack CST2 and the second memory semiconductor stack MST2 may have their heights that are substantially the same as each other.

The second core semiconductor stack CST2 may include a third core chip 100C and a fourth core chip 100D that are sequentially stacked. The second core semiconductor stack CST2 may further include second through vias TSV2. The second through vias TSV2 may penetrate from top to bottom surfaces of the second core semiconductor stack CST2.

The second memory semiconductor stack MST2 may include fifth, sixth, seventh, and eighth memory chips 200E, 200F, 200G, and 200H that are sequentially stacked. Each of the memory chips 200E, 200F, 200G, and 200H may include chip vias and chip lines.

One (or more) of the second lower lines NIL2 may be exposed at a top surface of the second lower redistribution layer NRDL2 and may be electrically connected to the second core semiconductor stack CST2. One (or more) of the second lower lines NIL2 may be exposed at a top surface of the second lower redistribution layer NRDL2 and may be electrically connected to the second core semiconductor stack CST2.

The fifth, sixth, seventh, and eighth memory chips 200E, 200F, 200G, and 200H of the second memory semiconductor stack MST2 may be electrically connected through the chip vias, the chip lines, and the second lower redistribution layer NRDL2 to the third and fourth core chips 100C and 100D of the second core semiconductor stack CST2.

A second molding layer MOL2 may be formed to cover the second core semiconductor stack CST2 and the second memory semiconductor stack MST2. The second molding layer MOL2 may fill a space between the second core semiconductor stack CST2 and the second memory semiconductor stack MST2.

Afterwards, a polishing process may be performed such that the second molding layer MOL2 is polished until the top surface of the second core semiconductor stack CST2 and the top surface of the second memory semiconductor stack MST2 are exposed. The polishing process may allow the semiconductor stacks CST2 and MST2 to lie at the same level as that of the second molding layer MOL2. In an implementation, the polishing process may cause the semiconductor stacks CST2 and MST2 to become coplanar with the second molding layer MOL2.

Figure 12:
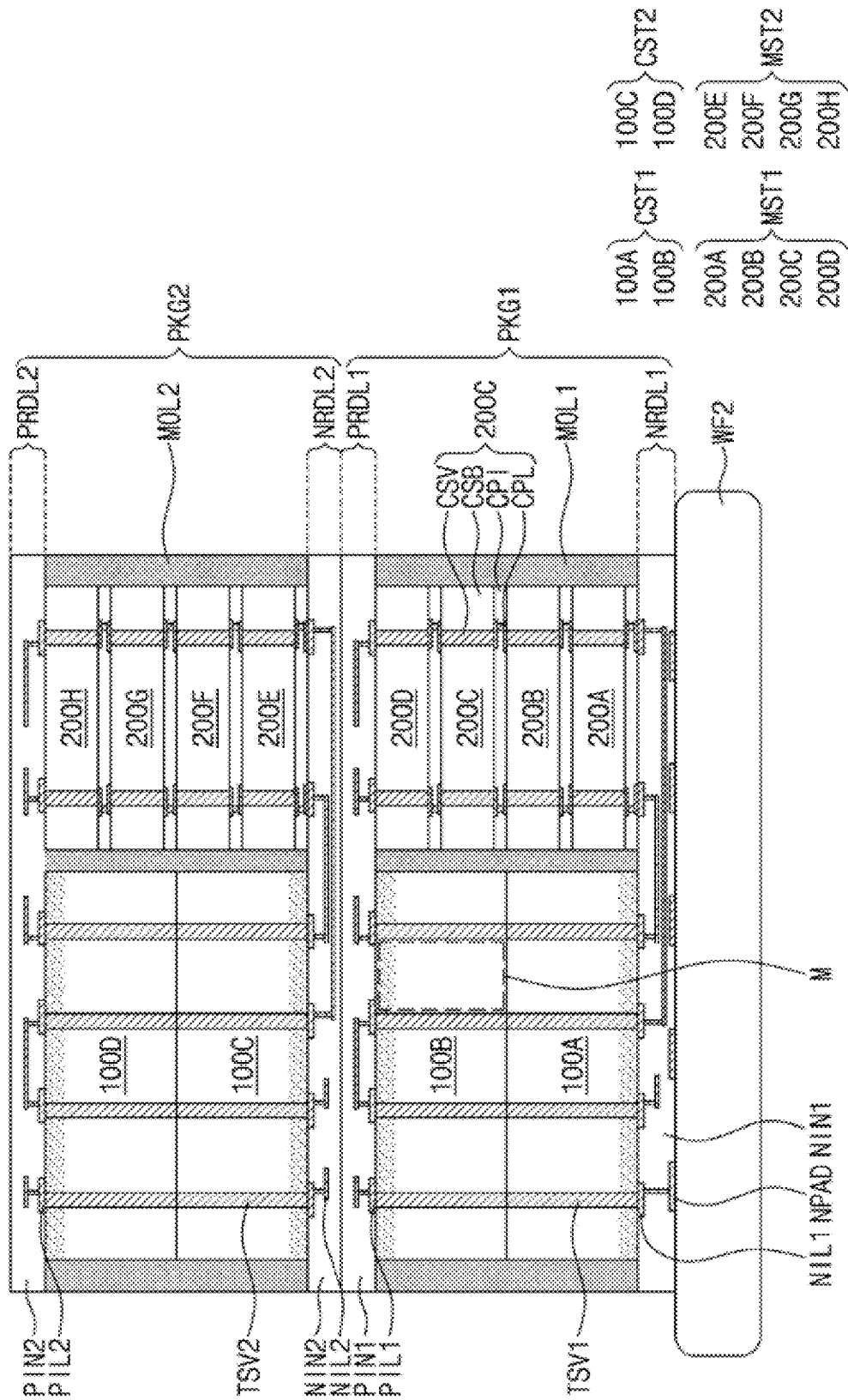

Referring to FIG. 12, a second upper redistribution layer PRDL2 may be formed on the semiconductor stacks CST2 and MST2 and the second molding layer MOL2. The formation of the second upper redistribution layer PRDL2 may include forming second upper lines PIL2 and a second upper dielectric layer PIN2.

One (or more) of the second upper lines PIL2 exposed at a bottom surface of the second upper redistribution layer PRDL2 may be electrically connected to the second core semiconductor stack CST2. Another one (or more) of the second upper lines PIL2 exposed at the bottom surface of the second upper redistribution layer PRDL2 may be electrically connected to the second memory semiconductor stack MST2. The second core semiconductor stack CST2 and the second memory semiconductor stack MST2 may be electrically connected to each other through the second upper lines PIL2 of the second upper redistribution layer PRDL2.

A second package PKG2 may be constituted by the second lower redistribution layer NRDL2, the second core semiconductor stack CST2, the second memory semiconductor stack MST2, the second molding layer MOL2, and the second upper redistribution layer PRDL2. In an implementation, the processes of FIGS. 10 to 12 may be performed to form the second package PKG2 on the first package PKG1.

In an implementation, the second package PKG2 may be further provided thereon with an additional package including one or more of a core semiconductor stack and a memory semiconductor stack, and in this case, there may be a variation in the number of core chips and the number of memory chips. The additional package may be formed by repeatedly performing the processes of FIGS. 10 to 12.

Figure 13:
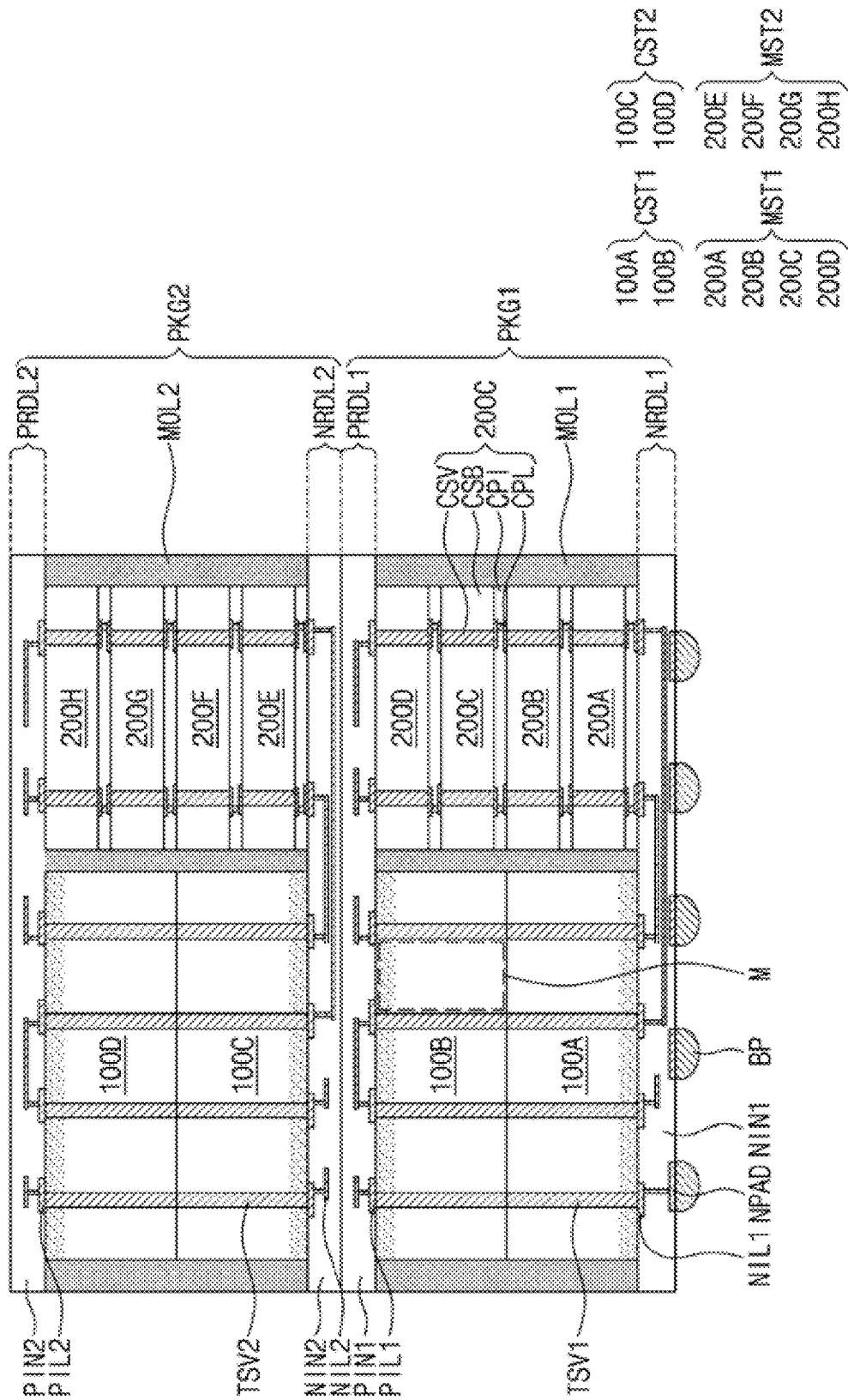

Referring to FIG. 13, a separation process may be performed to remove the second wafer WF2 from the first package PKG1. The separation process may separate the second wafer WF2 from the first lower redistribution layer NRDL1. Substrate bumps BP may be formed on the lower pads NPAD of the first lower redistribution layer NRDL1. The substrate bumps BP may include a conductive material, and may have, e.g., solder ball shapes, bump shapes, or pillar shapes.

Referring back to FIG. 1, a package substrate PSUB may be provided below the first package PKG1. The package substrate PSUB may include a dielectric base layer PBS, package substrate pads PPAD, terminal pads BPAD, and package substrate lines PIL.

The substrate bumps BP may be correspondingly connected to the package substrate pads PPAD on a top surface of the package substrate PSUB. The substrate bumps BP may be between the package substrate PSUB and the first package PKG1. The substrate bumps BP may electrically connect the package substrate PSUB to the first package PKG1.

A substrate under-fill layer SUF may be formed between the package substrate PSUB and the first package PKG1. The substrate under-fill layer SUF may fill a space between the substrate bumps BP and may encapsulate the substrate bumps BP.

External terminals PBP may be formed on a bottom surface of the package substrate PSUB. The external terminals PBP may be on bottom surfaces of the terminal pads BPAD. The external terminals PBP may be electrically connected to the package substrate lines PIL.

The external terminal PBP may be coupled to an external device. Therefore, external electrical signals may be transmitted through the external terminals PBP to or from the package substrate pads PPAD.

By way of summation and review, when stacking a plurality of semiconductor device, it may be required to promptly drive the stacked semiconductor devices. A semiconductor device may be electrically connected through a conductive via to other semiconductor device or a printed circuit board. A conductive via may accomplish high transfer speeds. High integration in semiconductor device may use reliable conductive vias.

A semiconductor device according to an embodiment may be configured such that a redistribution layer is between core semiconductor stacks and between memory semiconductor stacks. Accordingly, it may be possible to increase a signal transmission speed for semiconductor chips in an upper portion of a semiconductor stack and at the same time to form a plurality of memory and core chips while maintaining a large area that a package substrate occupies.

One or more embodiments may provide a semiconductor device including semiconductor stacks.

One or more embodiments may provide a semiconductor device whose bandwidth is increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
 a substrate;
 a first package on the substrate; and
 a second package on the first package,
 wherein:
 the first package includes:
  a first lower redistribution layer;
  a first core semiconductor stack on the first lower redistribution layer, the first core semiconductor stack including a first core chip and a first through via that extends from the first lower redistribution layer and penetrates through the first core chip; and
  a first memory semiconductor stack on the first lower redistribution layer,
 the first memory semiconductor stack includes a plurality of first memory chips that are stacked on the first lower redistribution layer,
 the second package includes:
  a second lower redistribution layer;
  a second core semiconductor stack on the second lower redistribution layer, the second core semiconductor stack including a second core chip on the second lower redistribution layer; and
  a second memory semiconductor stack on the second lower redistribution layer,
 the second memory semiconductor stack includes a plurality of second memory chips that are stacked on the second lower redistribution layer,
 the first through via penetrates through the first core semiconductor stack, and
 the first lower redistribution layer and the second lower redistribution layer are electrically connected to each other through the first through via.

2. The semiconductor device as claimed in claim 1, wherein:
 the first lower redistribution layer includes a plurality of first lower lines, one first lower line of the plurality of first lower lines is electrically connected to the first core semiconductor stack, and
 another first lower line of the plurality of first lower lines is electrically connected to the first memory semiconductor stack.

3. The semiconductor device as claimed in claim 2, wherein:
 the second lower redistribution layer includes a plurality of second lower lines, one second lower line of the plurality of second lower lines is electrically connected to the second core semiconductor stack, and
 another second lower line of the plurality of second lower lines is electrically connected to the second memory semiconductor stack.

4. The semiconductor device as claimed in claim 1, wherein:
 at least one first memory chip of the plurality of first memory chips includes a first chip via, and
 second chip of the plurality of second memory chips includes a second chip via.

5. The semiconductor device as claimed in claim 4, wherein:
 the plurality of first memory chips are electrically connected to the first lower redistribution layer through the first chip via, and
 the plurality of second memory chips are electrically connected to the second lower redistribution layer through the second chip via.

6. The semiconductor device as claimed in claim 1, wherein an area of the first package is in a range of about 400 square millimeters to about 1,600 square millimeters.

7. The semiconductor device as claimed in claim 1, wherein the first memory semiconductor stack has a height that is the same as a height of the first core semiconductor stack, as measured from the first lower redistribution layer in a vertical direction.

8. The semiconductor device as claimed in claim 1, wherein:
 the first package further includes a first upper redistribution layer, and
 the first core chip is electrically connected to the plurality of first memory chips through the first upper redistribution layer.

9. The semiconductor device as claimed in claim 8, wherein:
 the first upper redistribution layer includes a plurality of first upper lines,
 the second lower redistribution layer includes a plurality of second lower lines, and
 at least one first upper line of the plurality of first upper lines and at least one second lower line of the plurality of second lower lines are connected to electrically connect the first upper redistribution layer to the second lower redistribution layer.

10. The semiconductor device as claimed in claim 1, wherein:
 the second package further includes a second upper redistribution layer, and
 the second upper redistribution layer is on and electrically connected to the second core semiconductor stack and the second memory semiconductor stack.

11. The semiconductor device as claimed in claim 1, wherein:
 the first core chip is one of a plurality of first core chips,
 the first core semiconductor stack includes the plurality of the first core chips stacked on the first lower redistribution layer, and
 the plurality of first core chips are electrically connected to each other through the first through via.

12. The semiconductor device as claimed in claim 1, wherein:
 the second core chip is one of a plurality of second core chips,
 the second core semiconductor stack includes a second through via and the plurality of the second core chips are stacked on the second lower redistribution layer, and
 the plurality of second core chips are electrically connected to each other through the second through via.

13. The semiconductor device as claimed in claim 1, wherein the plurality of first memory chips and the plurality of second memory chips include dynamic random access memory (DRAM) chips.

14. The semiconductor device as claimed in claim 1, wherein:
 the first core chip includes a central processing unit (CPU), and
 the second core chip includes a graphic processing unit (GPU).

15. The semiconductor device as claimed in claim 1, wherein:
  the first lower redistribution layer further includes a plurality of lower pads, and
  the plurality of lower pads are exposed at a bottom surface of the first lower redistribution layer and are electrically connected to an external device.

16. A semiconductor device, comprising:
  a lower redistribution layer;
  an upper redistribution layer on the lower redistribution layer; and
  a core semiconductor stack and a memory semiconductor stack between the lower redistribution layer and the upper redistribution layer,
  wherein:
  the core semiconductor stack includes:
    a first core chip adjacent to the lower redistribution layer, the first core chip including a first front-side structure and a first back-side structure;
    a second core chip on the first core chip and adjacent to the upper redistribution layer, the second core chip including a second front-side structure and a second back-side structure; and
    a through via that extends through the first core chip from the lower redistribution layer to the upper redistribution layer,
  the memory semiconductor stack includes a plurality of memory chips that are stacked between the lower redistribution layer and the upper redistribution layer,
  the first front-side structure of the first core chip is in contact with the lower redistribution layer,
  the second front-side structure of the second core chip is in contact with the upper redistribution layer, and
  the first back-side structure of the first core chip is in contact with the second back-side structure of the second core chip.

17. The semiconductor device as claimed in claim 16, wherein:
  the plurality of memory chips include a chip via therein, and
  the plurality of memory chips are electrically connected to each other through the chip via.

18. The semiconductor device as claimed in claim 16, wherein:
  the upper redistribution layer includes a plurality of upper lines, one upper line of the plurality of upper lines is electrically connected to the memory semiconductor stack, and
  another upper line of the plurality of upper lines is electrically connected to the core semiconductor stack.

19. A semiconductor package, comprising:
  a package substrate;
  a semiconductor device on the package substrate;
  a plurality of substrate bumps between the package substrate and the semiconductor device; and
  an under-fill layer that fills a space between the substrate bumps,
  wherein:
  the semiconductor device includes:
    a substrate;
    a first package on the substrate; and
    a second package on the first package,
  the first package includes:
    a first lower redistribution layer;
    a first core semiconductor stack on the first lower redistribution layer, the first core semiconductor stack including a first core chip and a first through via that penetrates through the first core chip from the first lower redistribution layer; and
    a first memory semiconductor stack on the first lower redistribution layer,
  the first memory semiconductor stack includes a plurality of first memory chips that are stacked on the first lower redistribution layer,
  the second package includes:
    a second lower redistribution layer;
    a second core semiconductor stack on the second lower redistribution layer, the second core semiconductor stack including a second core chip on the second lower redistribution layer; and
    a second memory semiconductor stack on the second lower redistribution layer,
  the second memory semiconductor stack includes a plurality of second memory chips that are stacked on the second lower redistribution layer,
  the first through via penetrates through the first core semiconductor stack, and
  the first lower redistribution layer and the second lower redistribution layer are electrically connected to each other through the first through via.

20. The semiconductor package as claimed in claim 19, wherein:
  the package substrate includes a plurality of external terminals on one surface thereof, and
  the semiconductor device is coupleable to an external device.

* * * * *